(12) United States Patent
Lin et al.

(10) Patent No.: US 10,966,334 B2
(45) Date of Patent: Mar. 30, 2021

(54) CASING

(71) Applicant: Acer Incorporated, New Taipei (TW)

(72) Inventors: Wen-Hsin Lin, New Taipei (TW);
Cheng-Nan Ling, New Taipei (TW);
Wen-Chieh Tai, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 16/706,842

(22) Filed: Dec. 9, 2019

(65) Prior Publication Data
US 2020/0413558 A1 Dec. 31, 2020

(30) Foreign Application Priority Data

Jun. 25, 2019 (TW) .................................. 108208102

(51) Int. Cl.
*H05K 5/04* (2006.01)

(52) U.S. Cl.
CPC ...................................... *H05K 5/04* (2013.01)

(58) Field of Classification Search
CPC ....................................................... H05K 5/04
See application file for complete search history.

(56) References Cited

U.S. PATENT DOCUMENTS

| | | | | |
|---|---|---|---|---|
| 5,170,009 A | * | 12/1992 | Kadokura | C09D 5/448 174/363 |
| 2004/0165055 A1 | * | 8/2004 | Clifton | H05K 5/0243 347/217 |
| 2005/0138803 A1 | * | 6/2005 | Okawa | B41C 3/06 29/846 |
| 2011/0247863 A1 | * | 10/2011 | Watanabe | H05K 3/1216 174/254 |
| 2012/0224335 A1 | * | 9/2012 | Yuan | H01L 24/83 361/749 |
| 2015/0061476 A1 | * | 3/2015 | Ishikura | H05K 5/0004 312/223.1 |
| 2015/0096797 A1 | * | 4/2015 | Kim | H05K 3/382 174/261 |
| 2016/0174395 A1 | * | 6/2016 | Seo | H01H 13/14 361/781 |
| 2020/0262743 A1 | * | 8/2020 | Kim | H05K 5/03 |

* cited by examiner

*Primary Examiner* — Hung V Ngo
(74) *Attorney, Agent, or Firm* — JCIPRNET

(57) ABSTRACT

A casing includes a substrate, a protection layer, a bottom coating layer, a coating film layer, and a surface coating layer. The substrate has a first surface. The protection layer covers the first surface and has a second surface opposite to the first surface. The bottom coating layer covers the second surface and has a third surface opposite to the second surface. The coating film layer covers the third surface and has a fourth surface opposite to the third surface. The surface coating layer covers the fourth surface. One of the first surface, the second surface, and the third surface has a concave-convex pattern.

9 Claims, 3 Drawing Sheets

CASING

CROSS-REFERENCE TO RELATED APPLICATION

This application claims the priority benefit of Taiwan patent application serial no. 108208102, filed on Jun. 25, 2019. The entirety of the above-mentioned patent application is hereby incorporated by reference herein and made a part of this specification.

BACKGROUND

Technical Field

The disclosure relates to a casing; in particular, the disclosure relates to a casing applied to electronic products.

Description of Related Art

Common electronic products, e.g., notebook computers, tablets, smart phones, other portable electronic devices, or desktop electronic devices, all include a casing to carry or protect electronic components or non-electronic components. While consumers are purchasing the electronic products, the computing processing performance and memory capacity of the electronic products are very important to the consumers. Besides, the appearance and the texture of the electronic products satisfying visual and tactile perceptions of the consumers may also affect the consumers' willingness to buy. Here, the appearance and the texture of the casing bring the most intuitive visual and tactile perceptions to the consumers.

In general, the casing can be categorized into a metal casing, a non-metal casing, and a composite casing. In view of the maturity of manufacturing technologies, the metal casing featuring the advantages of light weight, strong structural strength, long service life, flexible appearance design, and good texture, and thus the metal casing is widely favored by the consumers. Before the metal casing undergoes the surface treatment and is colored, the metal casing merely exhibits single primary color. The common surface treatment and coloring process include paint coloring, anodizing, vacuum coating, and plating. After the metal casing undergoes the surface treatment and is colored, the metal casing can produce visual effects of multiple colors, specific colors, or non-metallic primary colors. In order to prevent the metal casing from being oxidized as well as scratched and prevent the color of the metal casing from fading, an outer surface of the metal casing is covered by a protective film layer, but the presence of the protective film layer weakens the metal texture of the metal casing.

SUMMARY

The disclosure provides a casing, which owns excellent metallic luster and texture.

The disclosure provides a casing including a substrate, a protection layer, a bottom coating layer, a coating film layer, and a surface coating layer. The substrate has a first surface. The protection layer covers the first surface and has a second surface opposite to the first surface. The bottom coating layer covers the second surface and has a third surface opposite to the second surface. The coating film layer covers a third surface and has a fourth surface opposite to the third surface. The surface coating layer covers the fourth surface. One of the first surface, the second surface, and the third surface has a concave-convex pattern.

Based on the above, by forming the concave-convex pattern on one of the substrate, the protection layer, and the bottom coating layer, the casing provided herein can exhibit excellent metallic luster and texture.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1:
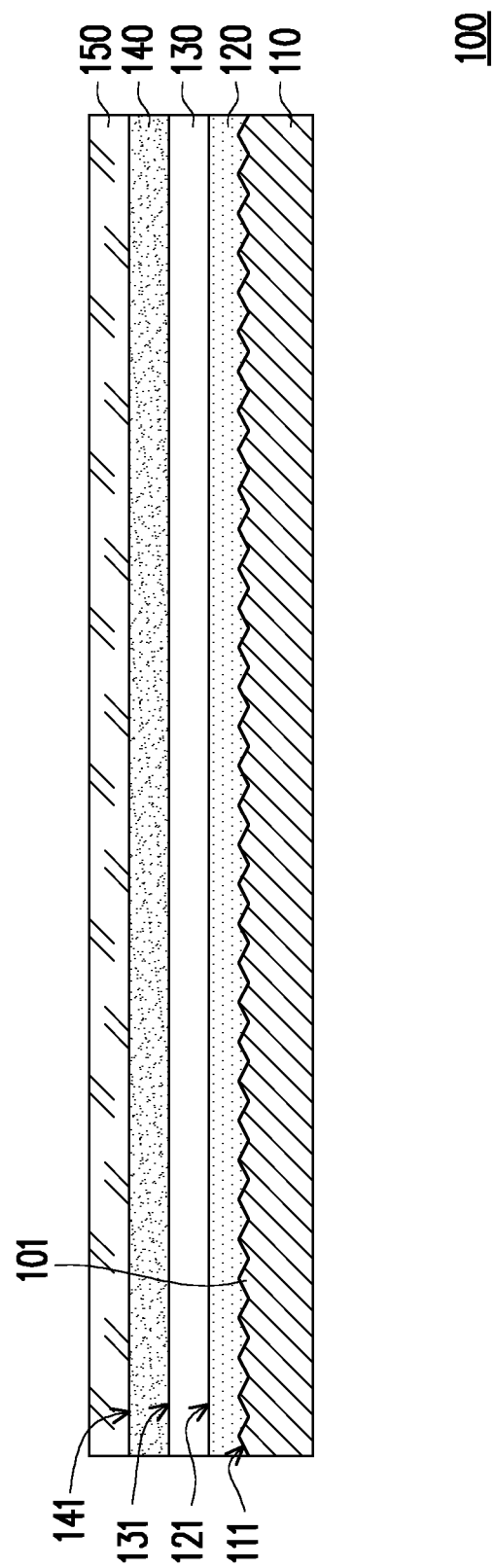
FIG. 1 is a schematic cross-sectional view of a casing according to a first embodiment of the disclosure.

FIG. 1 is a schematic cross-sectional view of a casing according to a first embodiment of the disclosure. Please refer to FIG. 1, in this embodiment, a casing 100 can be a metal casing, and the material thereof can be selected from aluminum-magnesium alloy. The aluminum-magnesium alloy casing not only has the characteristics of light weight, strong structural strength, and rust resistance but also exhibits excellent metallic luster. Specifically, the casing 100 includes a substrate 110, a protection layer 120, a bottom coating layer 130, a coating film layer 140, and a surface coating layer 150, wherein the substrate 110 may be made of the aluminum-magnesium alloy and has a first surface 111.

On the other hand, the first surface 111 is covered by the protection layer 120 and has a concave-convex pattern 101, and the surface roughness of the first surface 111 is greater than or equal to 30 µm. For instance, the substrate 110 may be formed by techniques such as die casting or semi-solid thixoforming, and a concave-convex structure corresponding to the concave-convex pattern 101 is pre-formed in the mold, so that the first surface 111 of the resulting substrate 110 which is done is uneven. In other feasible manufacturing processes, the first surface 111 of the substrate 110 is originally a smooth surface, and the first surface 111 becomes uneven after an imprinting process, a scribing process, a brushing process, or the like is performed on the first surface 111.

In this embodiment, the protection layer 120 may be an anti-oxidation film formed on the first surface 111 of the substrate 110 through a redox reaction, and a thickness of the protection layer 120 is within a range from 5 µm to 8 µm, thereby improving rust resistance of the substrate 110. The protection layer 120 has a second surface 121 opposite to the first surface 111, and the bottom coating layer 130 covers the second surface 121. For instance, the bottom coating layer 130 may be formed on the second surface 121 of the protection layer 120 by a spraying process, an electrophoretic coating process, a printing process, or the like, and a thickness of the protection layer 120 is within a range from 12 µm to 18 µm. On the other hand, the bottom coating layer 130 has a third surface 131 opposite to the second surface 121, and the coating film layer 140 covers the third surface 131. For instance, the coating film layer 140 may be a non-metal coating film formed on the third surface 131 by vacuum sputtering, and a thickness of the coating film layer 140 is within a range from 3 μm to 5 μm. The coating film layer 140 can be configured to enhance the metallic luster feel or exhibit visual effects of multiple colors, specific colors, or non-metallic primary colors.

The coating film layer 140 has a fourth surface 141 opposite to the third surface 131, and the surface coating layer 150 covers the fourth surface 141. For instance, the surface coating layer 150 may be formed on the fourth surface 141 of the coating film layer 140 by an evaporation process, a spraying process, an electrophoretic coating process, or the like, and a thickness of the surface coating layer 150 is within a range from 2 μm to 12 μm. The configuration of the surface coating layer 150 can protect the substrate 110, the protection layer 120, the bottom coating layer 130, and the coating film layer 140 from being scratched.

In short, by forming he concave-convex pattern 101 on the first surface 111 of the substrate 110, and with the determination of the thicknesses, the colors, and the transmittances of the protection layer 120, the bottom coating layer 130, the coating film layer 140, and the surface coating layer 150, the casing 100 can exhibit excellent metallic luster and texture or produce visual effects of multiple colors, specific colors, or non-metallic primary colors. On the other hand, the surface roughness of the first surface 111 is greater than or equal to 30 μm. With this design, the protection layer 120, the bottom coating layer 130, the coating film layer 140, and the surface coating layer 150 may have uneven profiles corresponding to the geometric contour change of the concave-convex pattern 101, so as to bring non-smooth tactile feel.

Other embodiments are described below, and the manufacturing processes, the structural configurations, or the parameter settings provided in each embodiment are substantially the same or similar and will not be explained again. The differences between the embodiments are explained in detail below.

Figure 2:
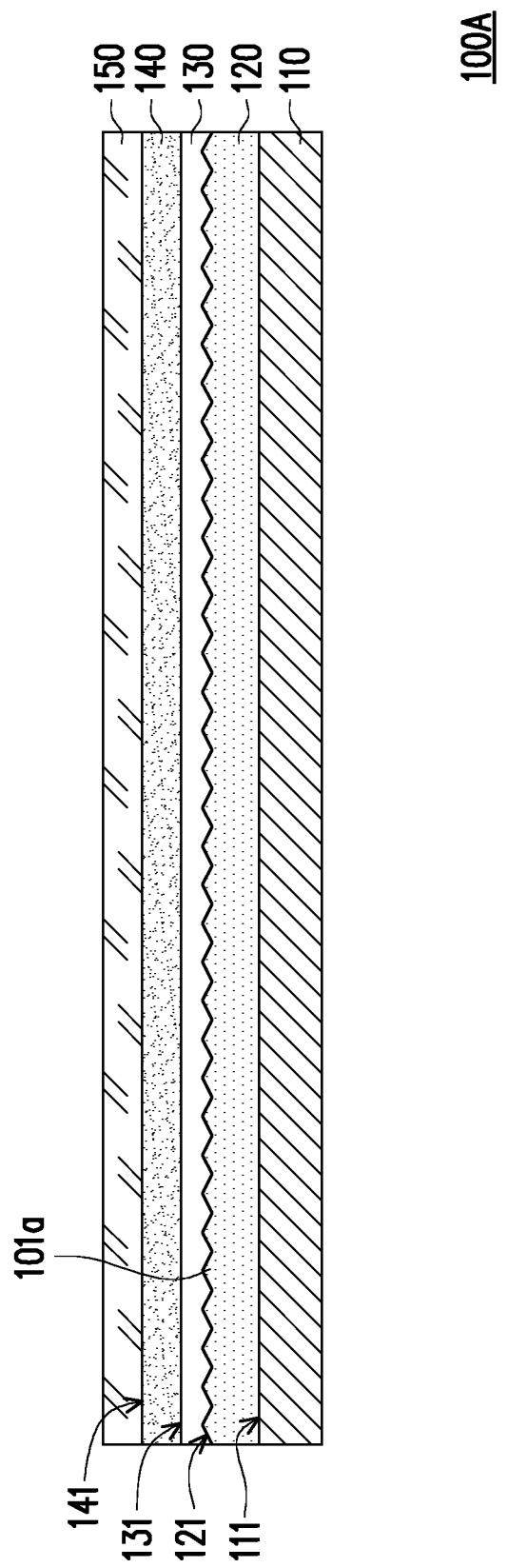
FIG. 2 is a schematic cross-sectional view of a casing according to a second embodiment of the disclosure.

FIG. 2 is a schematic cross-sectional view of a casing according to a second embodiment of the disclosure. Please refer to FIG. 2, the difference between the casing 100 provided in the first embodiment and the casing 100A provided in the embodiment lies in that the first surface 111 of the substrate 110 of the casing 100A may be a smooth surface, wherein the concave-convex pattern 101a is formed on the second surface 121 of the protection layer 120, and the surface roughness of the second surface 121 is within a range from 0.4 μm to 1.5 μm. By forming the concave-convex pattern 101a on the second surface 121 of the protection layer 120, and with the determination of the thicknesses, the colors, and the transmittances of the bottom coating layer 130, the coating film layer 140, and the surface coating layer 150, the casing 100A can exhibit excellent metallic luster and texture or produce visual effects of multiple colors, specific colors, or non-metallic primary colors.

Figure 3:
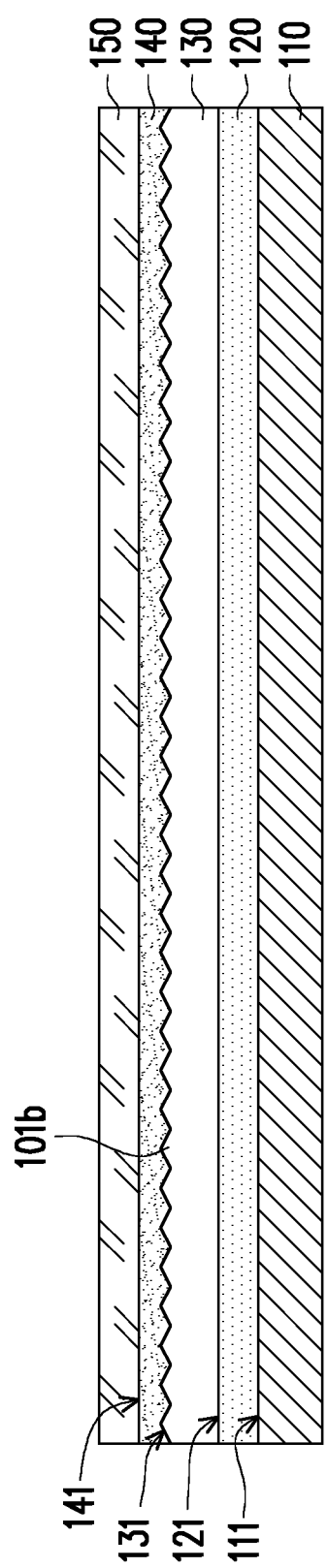
FIG. 3 is a schematic cross-sectional view of a casing according to a third embodiment of the disclosure.

FIG. 3 is a schematic cross-sectional view of a casing according to a third embodiment of the disclosure. Please refer to FIG. 3, the difference between the casing 100 provided in the first embodiment and the casing 100B provided in the embodiment lies in that the first surface 111 of the substrate 110 of the casing 100B may be a smooth surface, and the concave-convex pattern 101b is formed on the third surface 121 of the bottom coating layer 130. By forming the concave-convex pattern 101b on the third surface 131 of the bottom coating layer 130, and with the determination of the thicknesses, the colors, and the transmittances of the coating film layer 140 and the surface coating layer 150, the casing 100B can exhibit excellent metallic luster and texture or produce visual effects of multiple colors, specific colors, or non-metallic primary colors.

For instance, the surface roughness of the third surface 131 of the bottom coating layer 130 may be within a range from 17 μm to 20 μm. With this design, the outermost surface of the surface coating layer 150 still maintains a smooth tactile feel. Alternatively, the surface roughness of the third surface 131 of the bottom coating layer 130 may be greater than or equal to 30 μm. With this design, the coating film layer 140 and the surface coating layer 150 may have uneven profiles corresponding to the geometric contour change of the concave-convex pattern 101b, so as to bring non-smooth tactile feel.

To sum up, by forming the concave-convex pattern on one of the substrate, the protection layer, and the bottom coating layer, the casing provided in the disclosure can exhibit excellent metallic luster and texture. Further, the profile or the undulation of the concave-convex pattern can be adjusted according to the design requirements. By cooperating the profile or the undulation of the concave-convex pattern with the determination of the thicknesses, the colors, and the transmittances of other layers, the casing can exhibit the visual effects of multiple colors, specific colors, or non-metallic primary colors.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A casing comprising:
a substrate, having a first surface;
a protection layer, covering the first surface, wherein the protection layer has a second surface opposite to the first surface;
a bottom coating layer, covering the second surface, wherein the bottom coating layer has a third surface opposite to the second surface;
a coating film layer, covering the third surface, wherein the coating film layer has a fourth surface opposite to the third surface; and
a surface coating layer, covering the fourth surface, one of the first surface, the second surface, and the third surface having a concave-convex pattern.

2. The casing according to claim 1, wherein the first surface has the concave-convex pattern, and surface roughness of the first surface is greater than or equal to 30 μm.

3. The casing according to claim 1, wherein the second surface has the concave-convex pattern, and surface roughness of the second surface is within a range from 0.4 μm to 1.5 μm.

4. The casing according to claim 1, wherein the third surface has the concave-convex pattern, and surface roughness of the third surface is within a range from 17 μm to 20 μm.

5. The casing according to claim 1, wherein the third surface has the concave-convex pattern, and surface roughness of the third surface is greater than or equal to 30 μm.

6. The casing according to claim 1, wherein the protection layer is an anti-oxidation film, and a thickness of the protection layer is within a range from 5 μm to 8 μm.

7. The casing according to claim 1, wherein a thickness of the bottom coating layer is within a range from 12 μm to 18 μm.

8. The casing according to claim 1, wherein a thickness of the coating film layer is within a range from 3 μm to 5 μm.

9. The casing according to claim 1, wherein a thickness of the surface coating layer is within a range from 2 μm to 12 μm.

\* \* \* \* \*